US010649002B2

(12) United States Patent
Thompson et al.

(10) Patent No.: US 10,649,002 B2
(45) Date of Patent: May 12, 2020

(54) SELF-CALIBRATING MICROELECTROMECHANICAL SYSTEM DEVICES

(71) Applicant: INVENSENSE, INC., San Jose, CA (US)

(72) Inventors: Matthew Julian Thompson, Beaverton, OR (US); Joseph Seeger, Menlo Park, CA (US); Sarah Nitzan, Palo Alto, CA (US)

(73) Assignee: INVENSENSE, INC., San Jose, CA (US)

( * ) Notice: Subject to any disclaimer, the term of this patent is extended or adjusted under 35 U.S.C. 154(b) by 333 days.

(21) Appl. No.: 15/664,521

(22) Filed: Jul. 31, 2017

(65) Prior Publication Data

US 2019/0033342 A1  Jan. 31, 2019

(51) Int. Cl.

| G01P 21/00 | (2006.01) |
| G01P 15/12 | (2006.01) |
| G01L 27/00 | (2006.01) |
| G01R 33/00 | (2006.01) |
| G01P 15/125 | (2006.01) |

(52) U.S. Cl.
CPC ............ *G01P 21/00* (2013.01); *G01L 27/002* (2013.01); *G01P 15/12* (2013.01); *G01P 15/125* (2013.01); *G01R 33/0035* (2013.01)

(58) Field of Classification Search
CPC ............ G01P 15/12; G01P 2015/0805; G01P 2015/0851; G01P 2015/0862; G01P 2015/0868; G01P 15/0888; G01P 15/11; G01P 15/125; G01P 21/00; G01L 27/002; G01R 33/0035
USPC ....... 73/514.33, 1.06, 1.07, 1.59, 1.61, 1.62, 73/1.75, 1.38, 514.01, 514.02, 514.32, 73/514.18; 324/202, 244, 245, 260
See application file for complete search history.

(56) References Cited

U.S. PATENT DOCUMENTS

2016/0334441 A1* 11/2016 Tin .......................... G01P 21/00

\* cited by examiner

*Primary Examiner* — Robert R Raevis
(74) *Attorney, Agent, or Firm* — Amin, Turocy & Watson, LLP

(57) ABSTRACT

Techniques for self-adjusting calibration of offset and sensitivity of a MEMS accelerometer are provided. In one example, a system comprises a first microelectromechanical (MEMS) sensor. The first MEMS sensor comprises: a proof mass coupled to an anchor connected to a reference plane, wherein the proof mass is coupled to the anchor via a first spring and a second spring; a plurality of reference paddles coupled to the anchor; and a plurality of acceleration sensing electrodes disposed on the reference plane, wherein a first area of each of the acceleration sensing electrodes is larger than a second area of each of a plurality of reference electrodes associated with the plurality of reference paddles.

26 Claims, 11 Drawing Sheets

US 10,649,002 B2
// 1

SELF-CALIBRATING MICROELECTROMECHANICAL SYSTEM DEVICES

TECHNICAL FIELD

The subject disclosure relates generally to self-calibrating microelectromechanical system (MEMS) devices and, more particularly, to MEMS devices that provide for self-adjusting calibration of offset and sensitivity.

BACKGROUND

At the expense of signal to noise ratio (SNR), current MEMS accelerometers employ reference electrodes to reduce offset that arises from exogenous mechanical sources. These undesired exogenous sources, like thermal loads, packaging, fabrication, impact, are external loads and typically cause the accelerometer to deform which in-turn causes false acceleration outputs. These undesired exogenous sources have very different dynamics than the acceleration sensing. The acceleration sensing electrodes typically utilize a large, full scale range and move at a high speed. In comparison, the reference electrodes typically have much smaller, full scale range and move at a relatively lower speed. Currently, the reference electrodes are the same size as the acceleration electrodes.

Current designs for accelerometers require offset canceling. Offset paddles (reference electrodes) typically help removed offset caused from package stress. Active electrodes, used for sensing acceleration, are typically the same size as the offset paddles and the offset paddles takes up valuable space and are typically placed some distance away from the active electrodes. Typically, these devices calibrate offset only. Accordingly, devices that provide for self-adjusting calibration of offset and sensitivity are desired.

DETAILED DESCRIPTION

Figure 1:
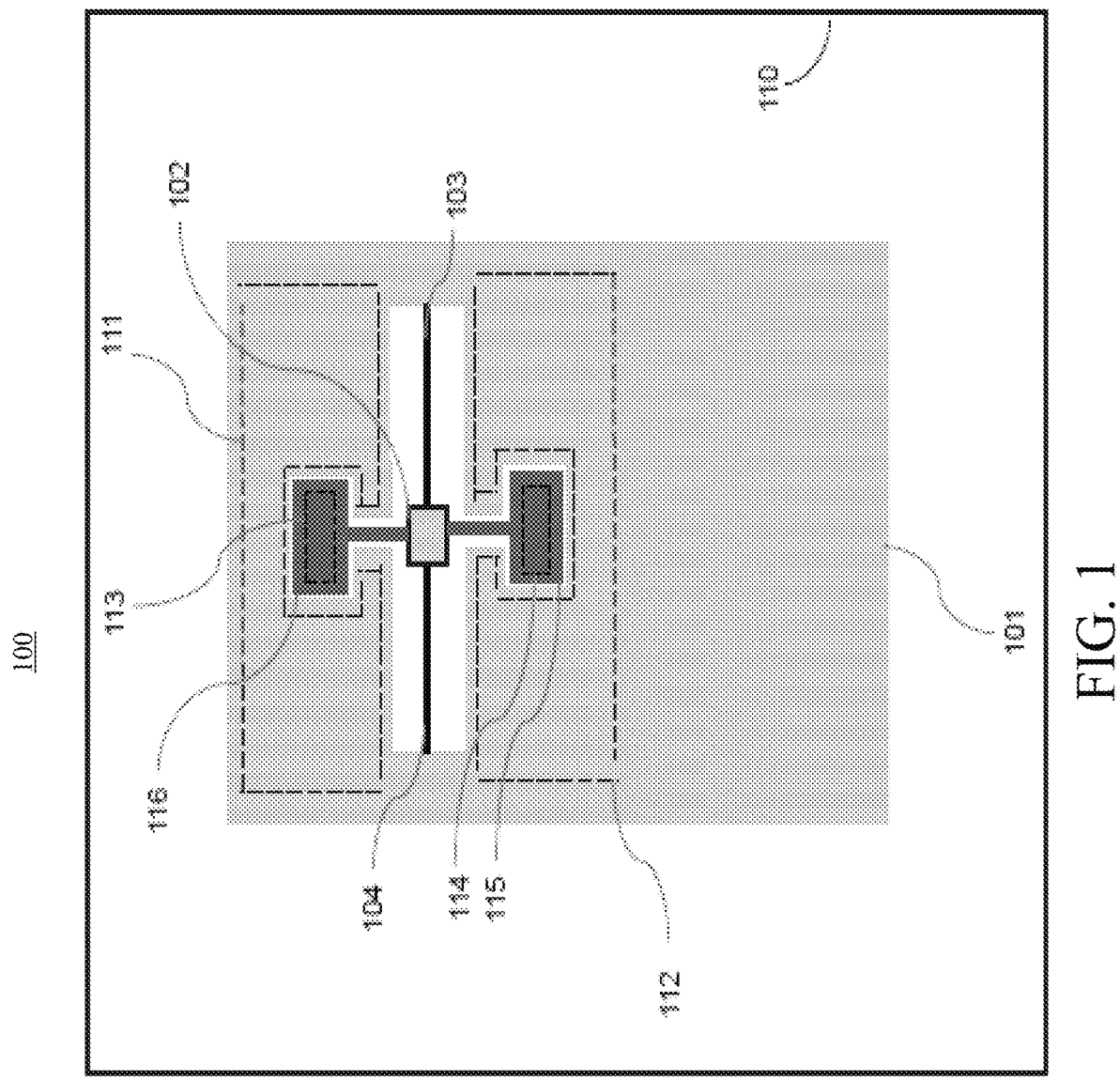
FIG. 1 illustrates an example block diagram of a MEMS device that can employ self-adjusting calibration of offset and sensitivity in accordance with one or more embodiments described herein.

One or more embodiments are now described with reference to the drawings, wherein like reference numerals are used to refer to like elements throughout. In the following description, for purposes of explanation, numerous specific details are set forth in order to provide a thorough understanding of the various embodiments. It is evident, however, that the various embodiments can be practiced without these specific details (and without applying to any particular networked environment or standard).

At the expense of signal to noise ratio (SNR), current MEMS accelerometers employ reference electrodes to reduce offset that arises from exogenous mechanical sources. These undesired exogenous sources, like thermal loads, packaging, fabrication, impact, are external loads and typically cause the accelerometer to deform which in-turn causes false acceleration outputs. These undesired exogenous sources have very different dynamics than the acceleration sensing. The acceleration sensing electrodes typically utilize a large, full scale range and move at a high speed. In comparison, the reference electrodes typically have much smaller, full scale range and move at relatively lower speed. Currently, the reference electrodes are the same size as the acceleration electrodes.

Current designs for accelerometers require offset canceling. Paddles help offset caused from package stress which can come from undesirable exogenous sources. However, paddles directly reduce the size of the active electrodes which lowers the SNR of the sensor. Typically, paddles are used to calibrate offset only. Accordingly, devices that provide for self-adjusting calibration of offset and sensitivity are desired.

One or more embodiments described herein can advantageously reduce the size of the paddles and increase sensitivity of a microelectromechanical system (MEMS) device without reducing offset (to provide for self-adjusting calibration of offset and sensitivity).

Embodiments described herein comprise systems, methods and/or apparatus that facilitate self-adjusting calibration of offset and sensitivity. One or more embodiments have reduced paddle size relative to conventional designs, paddles at the center of the electrode and/or calibration of offset and sensitivity.

In one example embodiment, a system comprises a first microelectromechanical (MEMS) sensor. The first MEMS sensor comprises: a proof mass coupled to an anchor connected to a reference plane, wherein the proof mass is coupled to the anchor via a first spring and a second spring; a plurality of reference paddles coupled to the anchor; and a plurality of acceleration sensing electrodes disposed on the reference plane, wherein a first area of each of the acceleration sensing electrodes is larger than a second area of each of a plurality of reference electrodes associated with the plurality of reference paddles.

In another example embodiment, a method of mechanical offset shift compensation in MEMS device is provided. The method comprises: sampling motion of a proof mass of the MEMS device, by a signal processor, to generate sense data comprising a first signal and a second signal; sampling reference electrodes of the MEMS device, by the signal processor, to generate reference data comprising a modified version of the second signal, wherein the modified version of the second signal is a third signal; modifying, by the signal processor, the third signal; and outputting, by the signal processor, the first signal by combining the sense data and the third signal.

In another example, a method of sensitivity shift compensation in a MEMS device is provided. The method comprises: sampling a MEMS device, by a signal processor, to generate sense data comprising an amplified first signal; sampling the MEMS device, by the signal processor, to generate reference data comprising information about amplification of the first signal; extracting from the MEMS device, by the signal processor, an amplification factor employed for the amplification of the first signal; and outputting, from the signal processor, a first signal by amplifying the sense data with the amplification factor.

In another example, a system is provided. The system can comprise a microelectromechanical (MEMS) sensor. The MEMS sensor can comprise: a proof mass coupled to an anchor connected to a reference plane; a plurality of reference paddles coupled to the anchor, wherein the plurality of reference paddles are coupled to the anchor and the plurality of reference electrodes disposed on the reference plane and comprising reference elements; and a plurality of acceleration sensing electrodes disposed on the reference plane, wherein a first level of sensitivity of the acceleration sensing electrodes is different than a second level of sensitivity of a plurality of reference electrodes associated with the plurality of reference paddles, and wherein the plurality of acceleration sensing electrodes comprise respective sensing elements disposed between the plurality of acceleration sensing electrodes and the proof mass.

In another embodiment, another method is provided. The method can comprise: measuring an average gap between a MEMS device and a reference plane, wherein the average gap is a first signal from the MEMS device; measuring a differential sensing gap, wherein the second signal is the differential sensing gap; and modifying the differential gap by the average gap.

One or more embodiments described herein can be employed in MEMS direct current (DC) sensor devices. One or more of the embodiments can result in increased signal-to-noise ratio, self-calibration. The embodiments can result in an improvement for a number of different DC sensing devices (e.g., accelerometer, magnetometer, barometer, etc). By reducing the offset rejection paddles, the sense electrodes can be increased, which can improve the SNR ratio.

Figure 2:
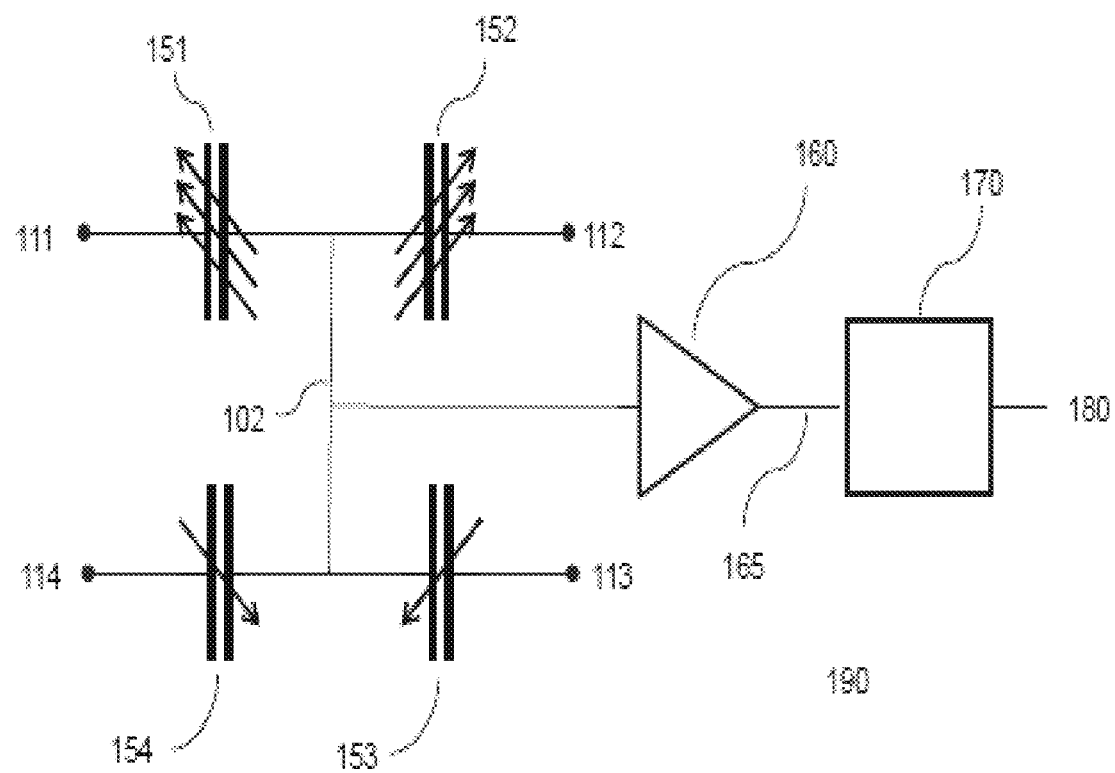
FIG. 2 illustrates a circuit for the MEMS device of FIG. 1 that can employ self-adjusting calibration of offset and sensitivity in accordance with one or more embodiments described herein.

Turning now to the drawings, FIG. 1 illustrates an example block diagram of a MEMS device 100 that can employ self-adjusting calibration of offset and sensitivity in accordance with one or more embodiments described herein. FIG. 2 illustrates a circuit 190 for the MEMS device 100 of FIG. 1 that can employ self-adjusting calibration of offset and sensitivity in accordance with one or more embodiments described herein. Repetitive description of like elements employed in other embodiments described herein is omitted for sake of brevity.

With reference to FIGS. 1 and 2, MEMS device 100 can comprise proof mass 101, anchor 102, springs 103, 104, reference plane 110, reference paddles 115, 116, sense electrodes 111, 112 and sensing elements 151, 152. In some embodiments, sensing elements 151, 152 can be referred to as "active electrodes 151, 152." As used herein, the term "active electrodes" can mean electrodes that detect the proof mass 101 (accordingly, "non-active electrodes" would detect the paddles since the paddles move much less than the more active components). In some embodiments, the MEMS device 100 can be or include an accelerometer, magnetometer and/or barometer. As used herein, the term "sense electrodes" can be "acceleration sensing electrodes" and "sensing elements" can be elements that sense acceleration. As used herein, the terms "reference data" and "reference electrode data" are interchangeable. As used herein, the terms "sense data" and "acceleration sensing data" and "acceleration sense data" can be interchangeable.

As shown in FIG. 1, proof mass 101 can be connected to anchor 102 via springs 103, 104. The anchor 102 can be mechanically connected to the reference plane 110. Reference paddles 115, 116 can be connected to anchor 102. Sense electrodes 111, 112 can be disposed on reference plane 110 and create sensing elements 151 and 152, shown in FIG. 2, between the proof mass 101 and sense electrodes 111, 112. Reference electrodes 113, 114 can be disposed on reference plane 110 and create reference elements 153 and 154, shown in FIG. 2.

Under out-of-plane acceleration, proof mass 101 can rotate about springs 103, 104 causing an out-of-plane motion of proof mass 101. The out-of-plane motion can cause a change in the sensing elements 151, 152. Acceleration data 165 can be created by exciting sense electrodes 111, 112 and connecting proof mass 101 via anchor 102 to buffer 160 and signal processor 170. When (or, in some embodiments, after) sense electrodes 111, 112 are excited, in some embodiments, signal 165 is proportional to the out-of-plane acceleration.

Under exogenous mechanical inputs, the reference plane 110 can deform thereby causing a change in sense elements 151, 152 and also causing a change in reference electrodes 153, 154, shown in FIG. 2. The change in sense elements 151, 152 due to the exogenous mechanical inputs can be removed. To remove the change in sense elements 151, 152 due to the exogenous mechanical inputs, the reference elements 153, 154 can be measured and later used to remove the change in sense elements 151, 152. Reference data 165 can be created by exciting sense elements 113, 114 and connecting anchor 102 to gain stage 160. When (or after) sense electrodes 113, 114 are excited, in some embodiments, signal 165 is proportional to the exogenous mechanical input. The reference data can be captured in the signal processor 170 of FIG. 2. The signal processor 170 can modify the reference data. The signal processor 170 can also combine the modified reference data with the acceleration sense data to output a signal proportional to the acceleration signal.

In some embodiments, the signal processor 170 modifies the reference data by amplifying the reference data and/or filtering the reference data. Since the reference data is slower than acceleration sense data, the reference data can be sampled or duty cycled at a lower rate to reduce the overall power consumption of the MEMS device 100.

MEMS device 100 can utilize the different dynamic behavior in different types of sensing electrodes (e.g., acceleration sensing electrodes and the reference electrodes) to increase the sensitivity of the MEMS accelerometer. The design shown in FIG. 1 can increase the sensitivity of the MEMS device 100 via decreasing size of the reference electrodes and increasing the acceleration electrode area. Since the reference electrodes and the acceleration electrodes are not area balanced, the reference electrode data can be modified accordingly before combining with the acceleration electrode data. Since the reference data has a smaller full scale range and is slower moving this data can have a separate signal path which can have a larger gain without a noise penalty. The MEMS device 100 can perform one or more functions such as that later described with reference to FIG. 4, which is shown as method 400.

Figure 4:
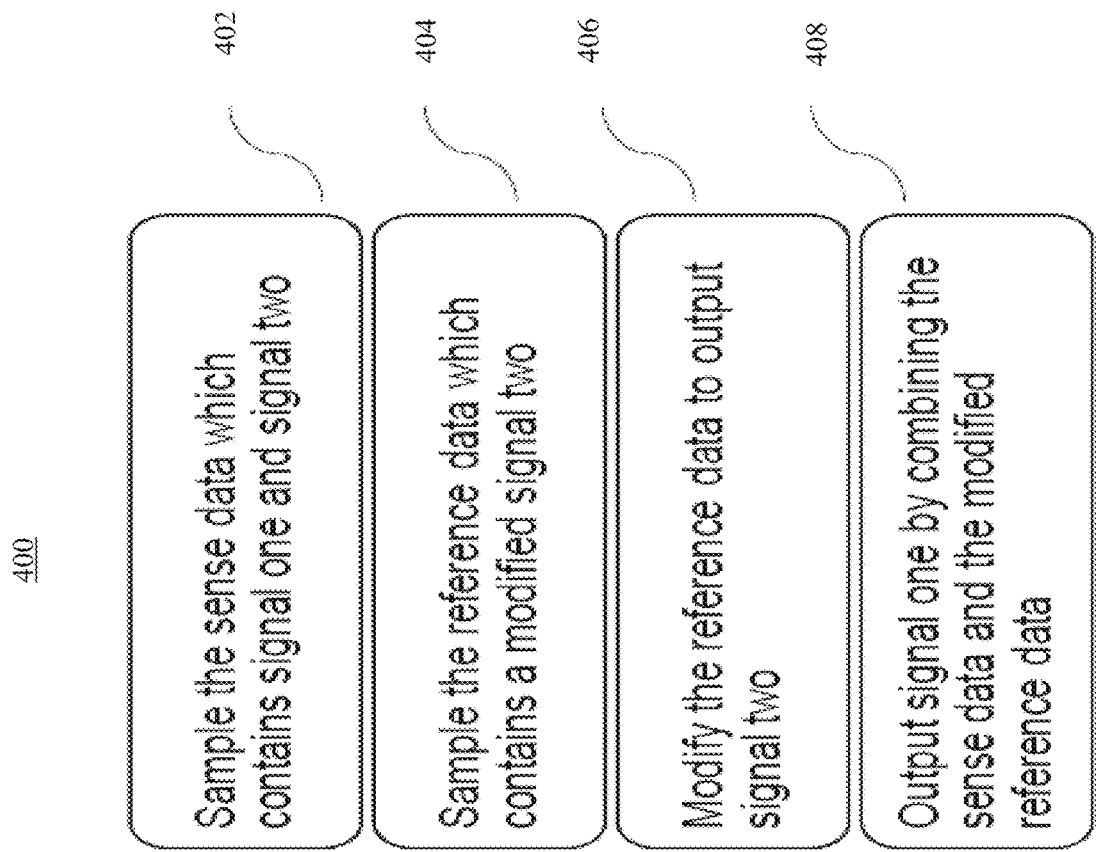
FIG. 4 illustrates a flow diagram of a method facilitating self-adjusting calibration of offset and sensitivity for a MEMS device of FIG. 1 in accordance with one or more embodiments described herein.

Turning now to FIG. 4, illustrated is a flow diagram of a method facilitating self-adjusting calibration of offset and sensitivity for a MEMS device of FIGS. 1 and 2 in accordance with one or more embodiments described herein. Repetitive description of like elements employed in other embodiments described herein is omitted for sake of brevity.

In the embodiment shown in FIG. 4, shown is a method for increasing the sensitivity of the MEMS accelerometer by decreasing the size of the reference electrodes and increasing the acceleration electrode area. Since the reference and acceleration electrodes are not area balanced, the reference electrode data can be modified accordingly before combining the reference electrode data back with the acceleration electrode data. Since the reference electrode data has a smaller full scale range and is slower moving, the reference electrode data can have a separate signal path. The signal path for the reference electrode data can have a larger gain than the path for the acceleration sensing data without a noise penalty.

As shown in FIG. 4, at 402, the method 400 can include sampling the sense data which contains signal one and signal two. In an embodiment, signal one could be acceleration data and signal two could be from an undesired exogenous load. The sense data can be signal 165 of FIG. 2 and can be captured by exciting sense electrodes 111, 112. The sense data can be captured in the signal processor 170 of FIG. 3.

At 404, method 400 can include sampling the reference data which contains a modified signal two. The reference data can be signal 165 and can be captured by exciting sense electrodes 113, 114. The reference data can be captured in the signal processor 170 of FIG. 2. The signal processor 170 can modify the reference data. The signal processor 170 can also combine the modified reference data with the acceleration sense data to output a signal proportional to the acceleration signal.

At 406, method 400 can comprise modifying the reference data to output signal two. At 408, method 400 can comprise outputting signal one by combining the sense data and the modified reference data. The output signal one can be shown as 180 of FIG. 2.

Figure 3:
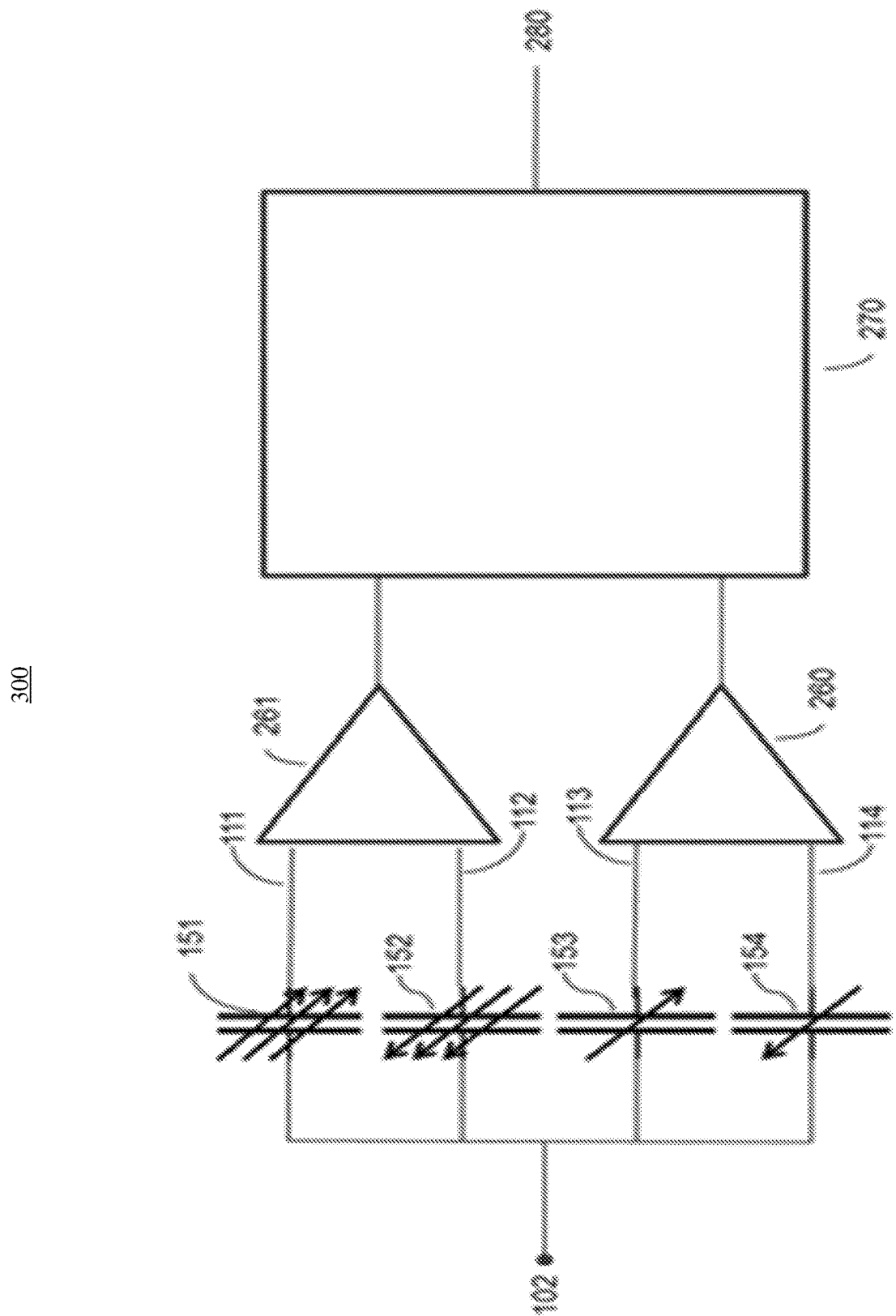
FIG. 3 illustrates another circuit for the MEMS device of FIG. 1 that can employ self-adjusting calibration of offset and sensitivity in accordance with one or more embodiments described herein.

FIG. 3 illustrates another circuit 300 for the MEMS device of FIG. 1 that can employ self-adjusting calibration of offset and sensitivity in accordance with one or more embodiments described herein. Repetitive description of like elements employed in other embodiments described herein is omitted for sake of brevity.

In this embodiment, there are two sense paths run at the same time (or concurrently). The first path comprises sense elements 151, 152 and buffer 261 while the second path comprises sense elements 153, 154 and buffer 260. Each path can output a signal from the buffers 260, 261. In this embodiment, buffer 260 can be sampled or duty cycled by signal processor 270 at a lower rate than buffer 261 to save power. The modified signal 280 can be output after the sampling and/or duty cycling.

Accordingly, as described and discussed with reference to FIGS. 1, 2, 3 and 4, active electrodes (e.g., sense electrodes 111, 112 to proof mass 101) typically have different mechanical dynamics than the paddles (e.g., reference paddles 115, 116 to electrodes 113, 114). Active electrodes can have a greater maximum displacement and or have greater maximum rate of change than paddles. One or more embodiments use the difference in dynamic behavior between the active electrodes and the paddle electrodes to improve performance, SNR, power consumption or other or all. One or more embodiments described herein can time multiplex the active electrodes at a first rate and the paddles at a second rate since, the paddles move at a slower rate than the active electrodes. For example, one or more embodiments described herein can time multiplex the active electrodes at a fast rate and the paddles at a slow rate. Since the dynamic range for the active electrodes and the paddles is different, the charge to voltage converter (C2V) can be designed for the two cases and the paddles can have a higher gain than the active electrodes thereby allowing the paddles to be smaller in area. With a significant reduction in the area of the paddles relative to conventional systems in which the area of the paddles and the active electrodes are the same (or approximately the same) size, each of the active electrodes can be designed to be formed to donut or be provided around the paddle to provide the offset and/or sensitivity calibration more effective.

Figure 5:
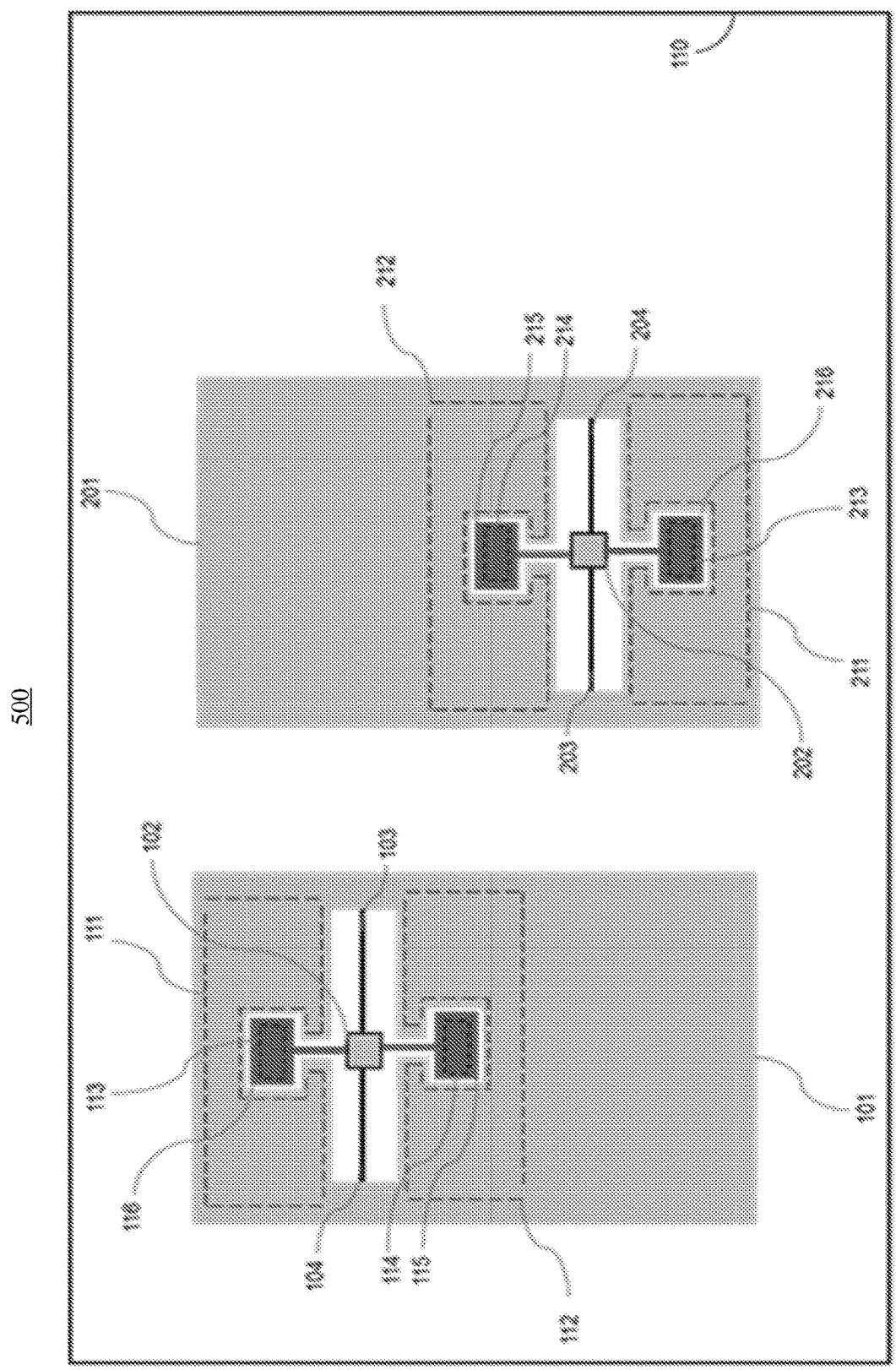
FIG. 5 illustrates example block diagram of another MEMS device that can employ self-adjusting calibration of offset and sensitivity in accordance with one or more embodiments described herein.

FIG. 5 illustrates example block diagram of another MEMS device that can employ self-adjusting calibration of offset and sensitivity in accordance with one or more embodiments described herein. Repetitive description of like elements employed in other embodiments described herein is omitted for sake of brevity.

The MEMS device 500 can have substantially the same components and/or functionality of MEMS device 100 but further comprises a second MEMS device (shown to the right of MEMS device 100). The proof mass 201 can be connected to anchor 202 via springs 203, 204. The anchor 202 can be mechanically connected to the reference plane 110. Reference paddles 215, 216 can be connected to anchor 202. Sense electrodes 211, 212 can be disposed on reference plane 110, between the proof mass 201 and sense electrodes 211, 212. Reference electrodes 213, 214 can be disposed on reference plane 110.

The proof masses 101, 201 can be mechanically uncoupled but coupled electrically to one another. For example, in some embodiments, proof masses 101, 201 can be electrically coupled to one another as shown at circuit 600 of FIG. 6, which will be discussed below. In another embodiment, the proof masses 101, 201 of FIG. 6 can be electrically coupled to one another as shown at circuit 200 of FIG. 2. In some embodiments, the circuitry of proof masses 101, 201 can be added to one another at processor 170.

Figure 6:
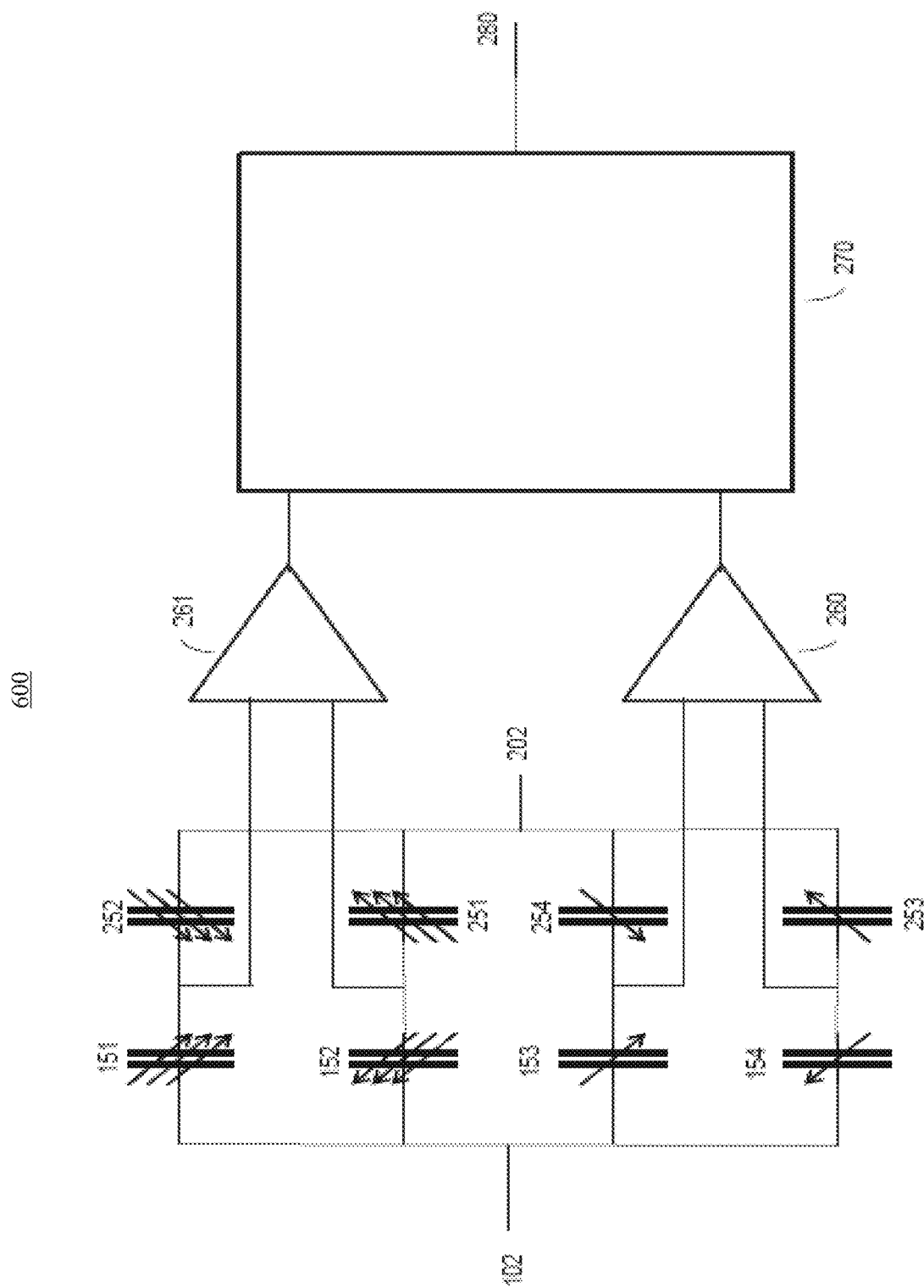
FIG. 6 illustrates a circuit for the MEMS device of FIG. 5 that can employ self-adjusting calibration of offset and sensitivity in accordance with one or more embodiments described herein.

FIG. 6 illustrates a circuit for MEMS device of FIG. 5 that can employ self-adjusting calibration of offset and sensitivity in accordance with one or more embodiments described herein. Repetitive description of like elements employed in other embodiments described herein is omitted for sake of brevity.

The circuit 600 is substantially the same in function and/or structure as the circuit 200 but is extended for the extra proof mass 201 of FIG. 5. The circuit 600 can provide for acceleration sensing with offset calibration. For example, reference elements 153 and 154 and sensing elements 151, 152 can be associated with and perform the function of MEMS device 100 while the capacitors 251, 252, 253, 254 are constructed in the complementary metal-oxide semiconductor (CMOS) as non-moving fixed capacitors and perform the function of MEMS device 600. In some embodiments, one or more of capacitors 251, 252, 253, 254 can be replaced with one or more resistors and/or transistors.

Figure 7:
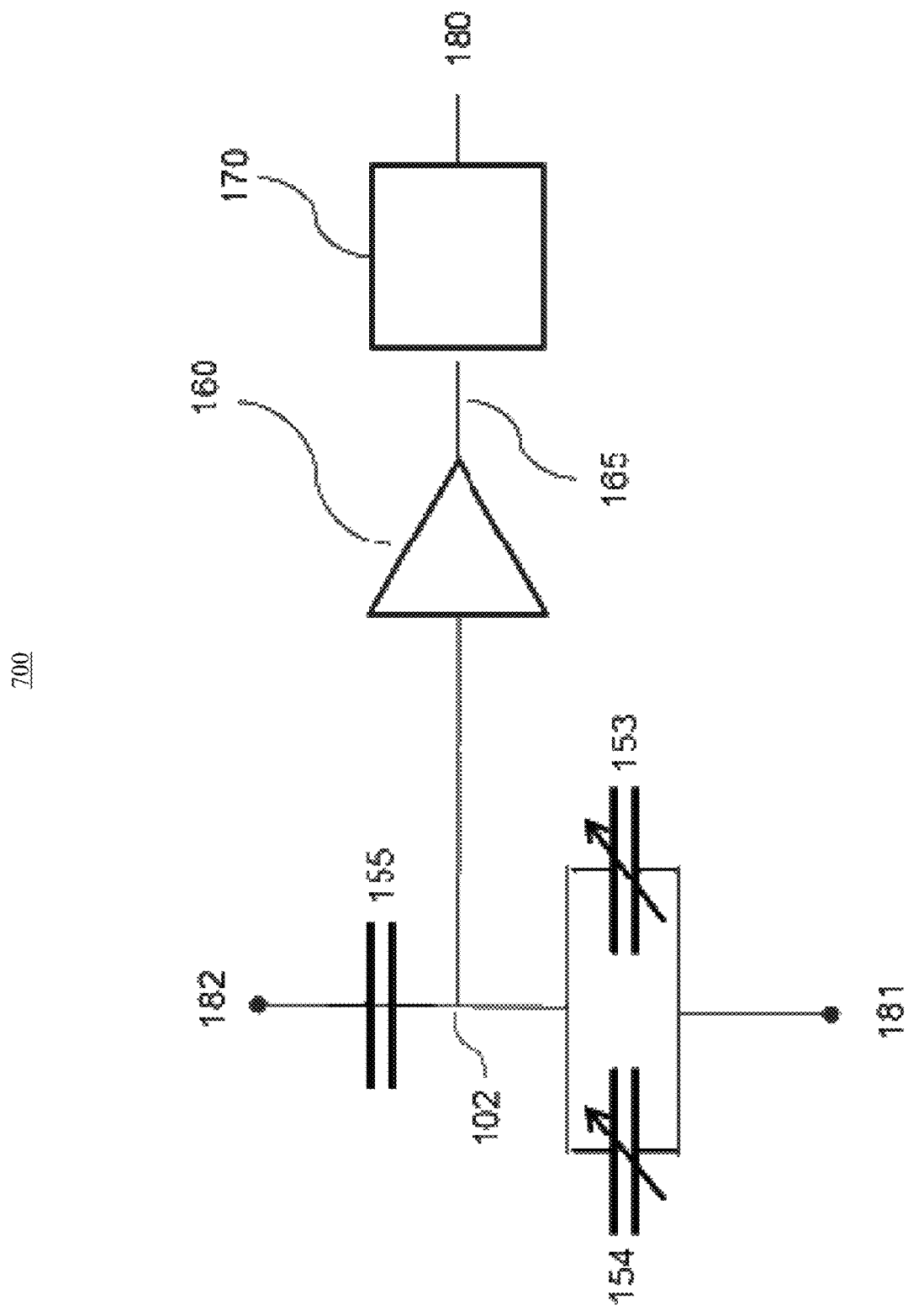
FIG. 7 illustrates a circuit for the MEMS device of FIG. 1 that can measure the gap of reference elements to facilitate self-adjusting calibration of offset and sensitivity in accordance with one or more embodiments described herein.

FIG. 7 illustrates a circuit for the MEMS device of FIG. 1 that can measure the gap of reference elements to facilitate self-adjusting calibration of offset and sensitivity in accordance with one or more embodiments described herein. Repetitive description of like elements employed in other embodiments described herein is omitted for sake of brevity. The circuit 700 can measure the gap of reference element 153, 154 using CMOS element 155. In this embodiment, the gap of the reference element can be used to trim sensitivity. Circuit 700 is similar to circuit 200 in some embodiments. In circuit 200, there can be 111 and 114, which are driven nodes, along with four capacitors. At circuit 700, similar structure is provided except one capacitor is removed and instead of four individual drives, there are two. Nodes 181 and 182 are driven nodes that can be driven together and if the sensing elements 154 and 153 move then that will go through the circuit and provide a signal output.

Figure 8:
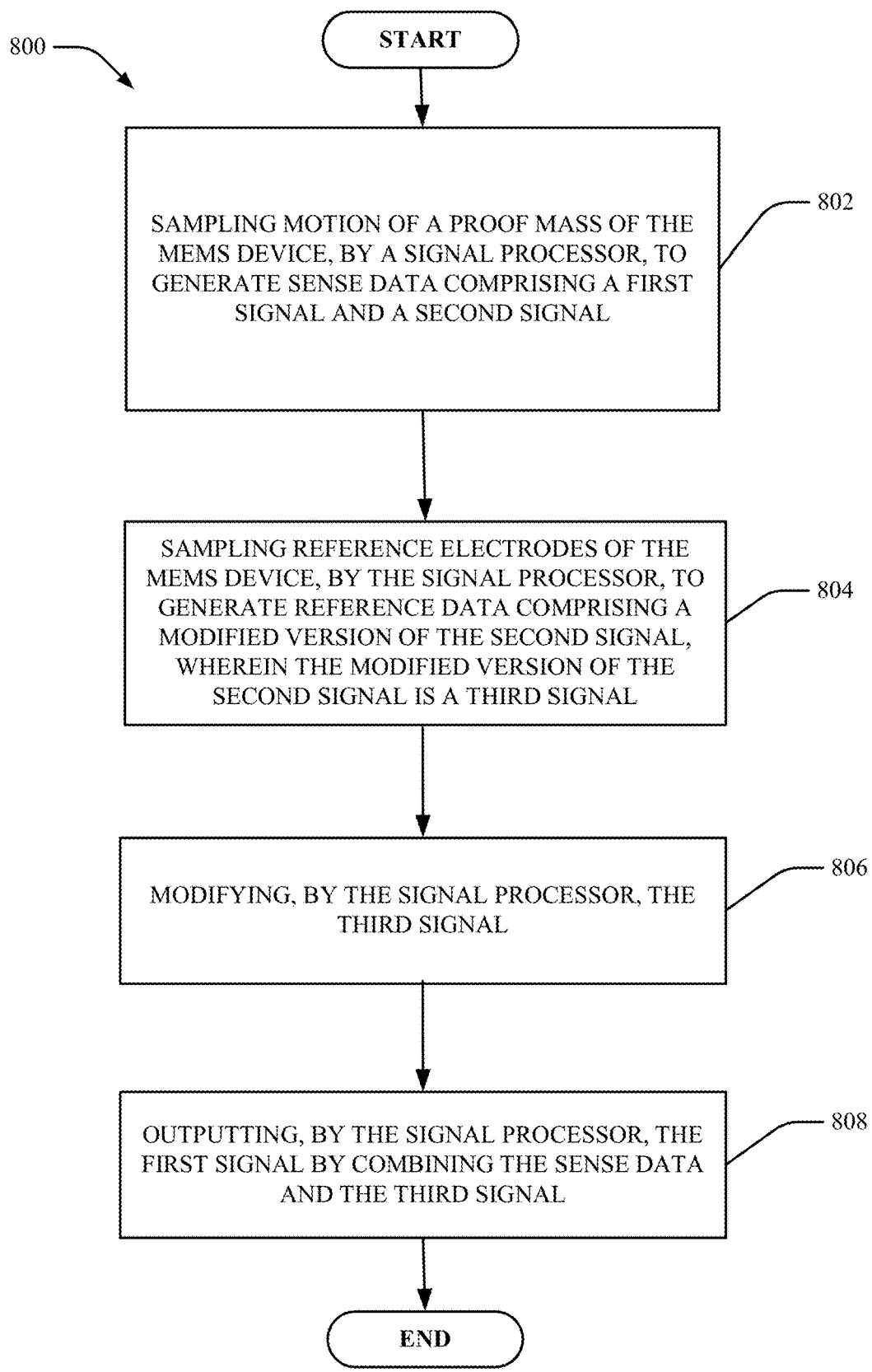
FIGS. 8 and 9 are example flowcharts of methods facilitating self-adjusting calibration of offset and sensitivity for a MEMS device in accordance with one or more embodiments described herein.

FIG. 7 illustrates a circuit employing the MEMS device of FIG. 1 employing reduced-size paddles. With reference to FIGS. 1, 6 and 8, the output of the MEMS device can primarily change due to the sense electrodes (e.g., sense electrodes 111, 112 of FIG. 1 and sense electrodes 111, 112 and 211, 212 of FIG. 6).

As used herein, the reference paddles 115, 116 have less motion and a much slower rate. As described above, the signal path can be designed to take advantage of these considerations. The active electrodes 111, 112 (or sense electrodes 111, 112, 211, 212 of FIG. 6) can be driven without the reference paddles 115, 116 at a fast rate. Periodically, the reference paddles 115, 116 are driven without the active electrodes at a slow rate with a higher charge to voltage converter C2V gain. In some embodiments, the reference paddles 115, 116 can be mechanically reduced in size relative to the active electrodes.

The reference paddles 115, 116 can be driven differentially to obtain an offset. The reference paddles 115, 116 can be driven in common mode to result in a measurement of the sensitivity shift.

Figure 9:
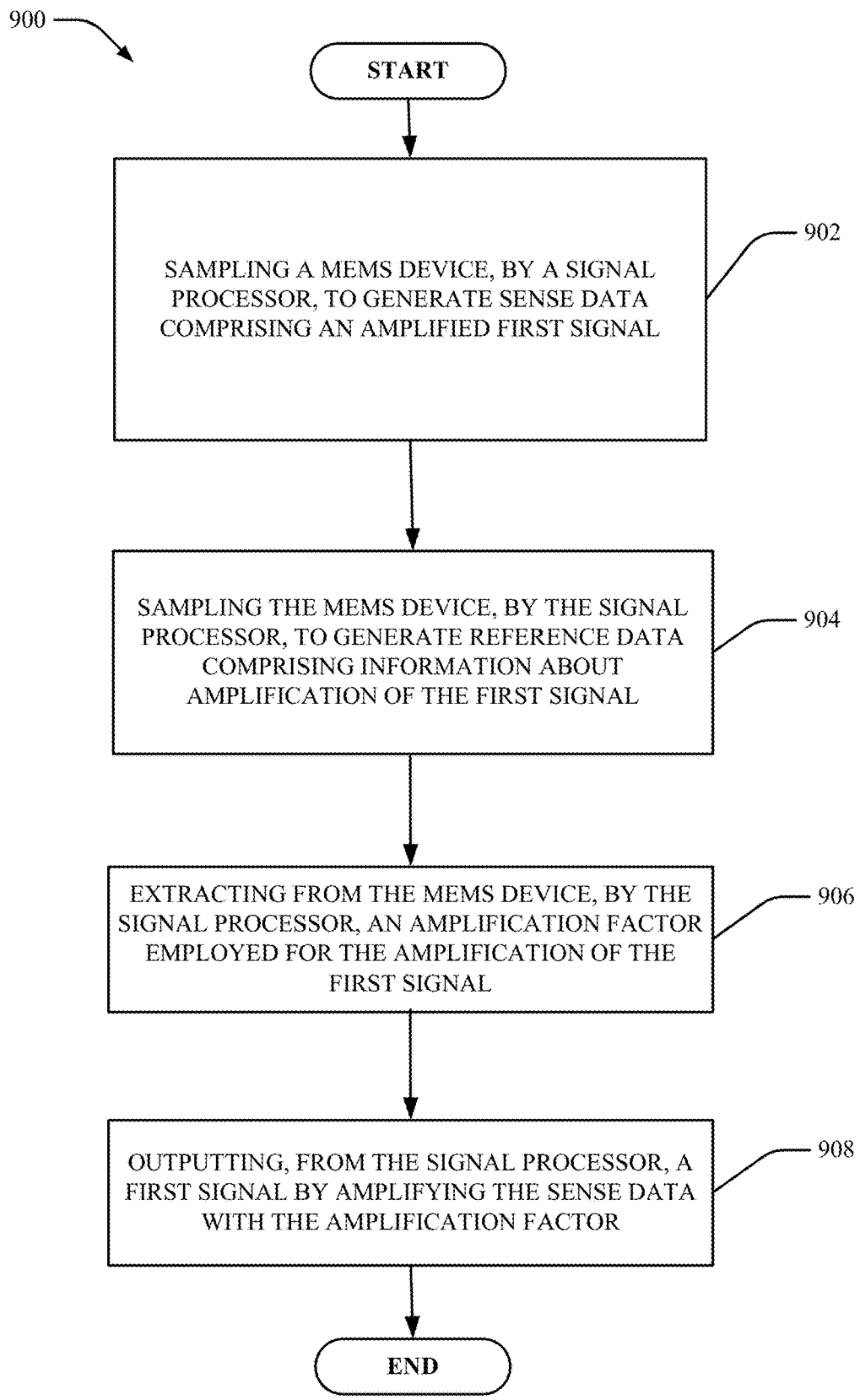
Figure 10:
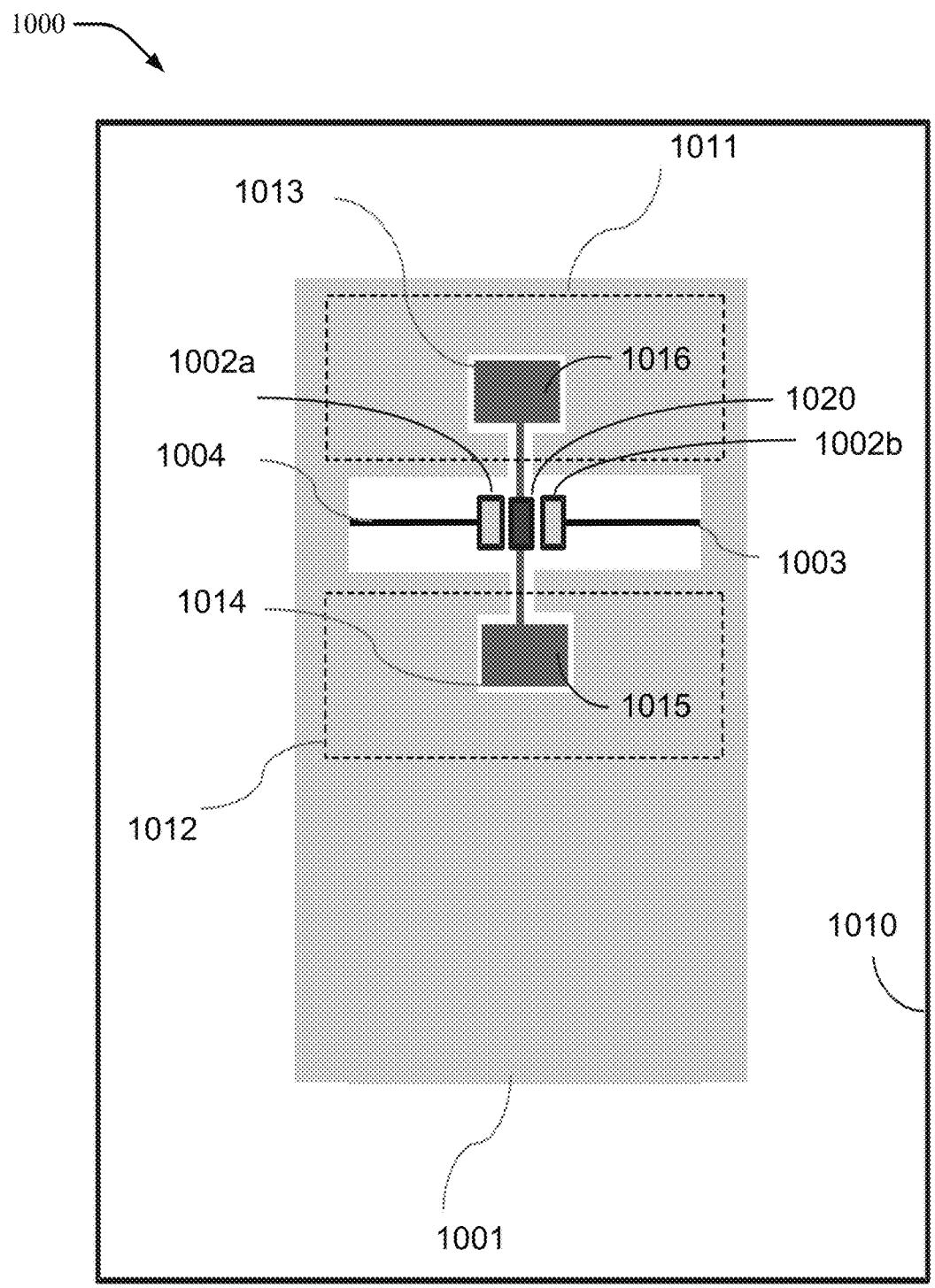
FIG. 10 illustrates example block diagram of another MEMS device that can employ self-adjusting calibration of offset and sensitivity in accordance with one of more embodiments described herein.

FIGS. 8, 9 and 10 are example flowcharts of methods facilitating self-adjusting calibration of offset and sensitivity for a MEMS device in accordance with one or more embodiments described herein. Repetitive description of like elements employed in other embodiments described herein is omitted for sake of brevity.

Turning first to FIG. 8, at 802, method 800 can comprise sampling motion of a proof mass of the MEMS device, by a signal processor, to generate sense data comprising a first signal and a second signal. At 804, method 800 can generate a third signal by sampling reference data from the reference electrodes, wherein the reference data is a modified version of the second signal. At 806, method 800 can comprise generating a fourth signal by modifying the third signal. At 808, method 800 can comprise outputting, by the signal processor, the first signal by combining the sense data and the fourth signal.

Turning now to FIG. 9, at 902, method 900 can comprise sampling a MEMS device, by a signal processor, to generate sense data comprising an amplified first signal. At 904, method 900 can comprise sampling the MEMS device, by the signal processor, to generate reference data comprising information about amplification of the first signal. At 906, method 900 can comprise extracting from the MEMS device, by the signal processor, an amplification factor employed for the amplification of the first signal. At 908, method 900 can comprise outputting, from the signal processor, a first signal by amplifying the sense data with the amplification factor.

FIG. 10 illustrates an example block diagram of a MEMS device 1000 that can employ self-adjusting calibration of offset and sensitivity in accordance with one or more embodiments described herein. The MEMS device 1000 is similar to the MEMS device 100 of FIG. 1, a major difference being that the MEMS device 1000 has multiple anchors 1002a, 1002b and 1020. The MEMS device 1000 has two anchors 1002a and 1002b coupled to the proof mass 1001 by way of the springs 1004 and 1003 respectively. The MEMS device 1000 has one anchor 1020 coupled to the reference paddles 1015, 1016. Repetitive description of like elements employed in other embodiments described herein is omitted for sake of brevity.

Figure 11:
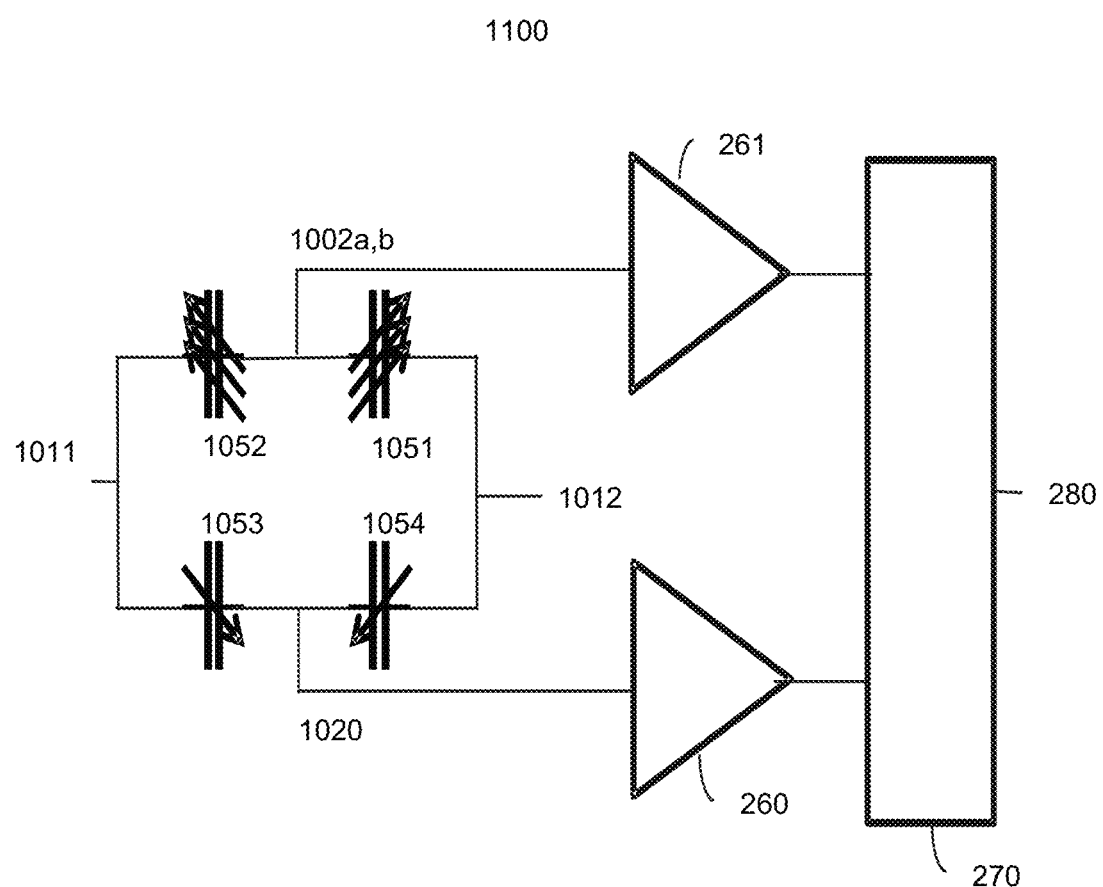
FIG. 11 illustrates a circuit for MEMS device of FIG. 10 that can employ self-adjusting calibration of offset and sensitivity in accordance with one or more embodiments described herein.

The MEMS device 1000 can comprise proof mass 1001, anchors 1002a, 1002b and 1020, springs 1003, 1004, reference plane 1010, reference paddles 1015, 1016, sense electrodes 1011, 1012 and sensing elements 1051, 1052 (shown in FIG. 11). In some embodiments, sensing elements 1051, 1052 can be referred to as "active electrodes 1051, 1052." As used herein, the term "active electrodes" can mean electrodes that detect the proof mass 1001 (accordingly, "non-active electrodes" would detect the paddles since the paddles move much less than the more active components). In some embodiments, the MEMS device 1000 can be or include an accelerometer, magnetometer and/or barometer. As used herein, the term "sense electrodes" can be "acceleration sensing electrodes" and "sensing elements" can be elements that sense acceleration. As used herein, the terms "reference data" and "reference electrode data" are interchangeable. As used herein, the terms "sense data" and "acceleration sensing data" and "acceleration sense data" can be interchangeable.

As shown in FIG. 10, proof mass 1001 can be connected to anchors 1002a and 1002b via springs 1004 and 1003 respectively. The anchors 1002a and 1002b can be mechanically connected to the reference plane 1010. Reference paddles 1015, 1016 can be connected to anchor 1020, which can also be mechanically connected to the reference plane 1010. In an another embodiment an anchor base mechanically couples anchors 1002a,1002b and 1020 to the reference plane. Sense electrodes 1011, 1012 can be disposed on reference plane 1010 and create sensing elements 1051 and 1052, shown in FIG. 11, between the proof mass 1001 and sense electrodes 1011, 1012. Reference electrodes 1013, 1014 can be disposed on reference plane 1010 and create reference elements 1053 and 1054, shown in FIG. 11.

Under out-of-plane acceleration, proof mass 1001 can rotate about springs 1003, 1004 causing an out-of-plane motion of proof mass 1001. The out-of-plane motion can cause a change in the sensing elements 1051, 1052. As illustrated in FIG. 11, there are two sense paths that run at the same time (or concurrently). The first path comprises sense elements 1051, 1052 and buffer 261 while the second path comprises reference elements 1053, 1054 and buffer 260. Each path can output a signal from the buffers 260, 261. In this embodiment, buffer 260 can be sampled or duty cycled by signal processor 270 at a lower rate than buffer 261 to save power. The modified signal 280 can be output after the sampling and/or duty cycling. As used in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software application or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can comprise, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "mobile device equipment," "mobile station," "mobile," subscriber station," "access terminal," "terminal," "handset," "mobile device" (and/or terms representing similar terminology) can refer to a wireless device utilized by a subscriber or mobile device of a wireless communication service to receive or convey data, control, voice, video, sound, gaming or substantially any data-stream or signaling-stream. The foregoing terms are utilized interchangeably herein and with reference to the related drawings. Likewise, the terms "access point (AP)," "Base Station (BS device)," "Node B (NB)," "evolved Node B (eNode B)," "home Node B (HNB)" and the like, are utilized interchangeably in the application, and refer to a wireless network component or appliance that transmits and/or receives data, control, voice, video, sound, gaming or substantially any data-stream or signaling-stream from one or more subscriber stations. Data and signaling streams can be packetized or frame-based flows.

Furthermore, the terms "device," "movable object," "mobile device," "subscriber," "customer," "consumer," "entity" and the like are employed interchangeably throughout, unless context warrants particular distinctions among the terms. It should be appreciated that such terms can refer to human entities or automated components supported through artificial intelligence (e.g., a capacity to make inference based on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of mobile device equipment. A processor can also be implemented as a combination of computing processing units.

As used herein, terms such as "data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can comprise both volatile and nonvolatile memory.

Memory disclosed herein can comprise volatile memory or nonvolatile memory or can comprise both volatile and nonvolatile memory. By way of illustration, and not limitation, nonvolatile memory can comprise read only memory (ROM), programmable ROM (PROM), electrically programmable ROM (EPROM), electrically erasable PROM (EEPROM) or flash memory. Volatile memory can comprise random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory (e.g., data storages, databases) of the embodiments are intended to comprise, without being limited to, these and any other suitable types of memory.

What has been described above res mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
   a first microelectromechanical (MEMS) sensor comprising:
   an anchor connected to a reference plane;
   a proof mass coupled to the anchor via at least one spring, wherein the proof mass is configured to move along a first direction in response to a sense excitation and along the first direction in response to an exogenous excitation;
   a plurality of sensing elements coupled between the reference plane and the proof mass and configured to be responsive to motion of the proof mass in the first direction,
   a plurality of reference paddles coupled to the anchor, wherein the reference paddles are configured to move along a second direction in response to an exogenous excitation;
   a plurality of reference elements coupled between the reference plane and the reference paddles and configured to be responsive to motion of the reference paddles in the second direction; wherein,
   the sensitivity level of the sensing elements in the first direction is different from the sensitivity level of the reference elements in the second direction.

2. The system of claim 1, wherein the sense excitation comprises any of acceleration, magnetic field or ambient pressure.

3. The system of claim 1, wherein the MEMS sensor further comprises:
   a buffer coupled to the first MEMS sensor; and
   a signal processor coupled to the buffer.

4. The system of claim 3, wherein the sensing elements are configured to output sense data in response to the sense excitation.

5. The system of claim 4, wherein the sensing elements are configured to output offset data and the reference elements are configured to output reference data in response to the exogenous excitation.

6. The system of claim 5, wherein the signal processor is configured to modify the reference data.

7. The system of claim 6, wherein the signal processor is further configured to output first data proportional to the sense excitation by combining the sense data and the offset data from sensing elements with a modified reference data when the system is subjected to both sense excitation and exogenous excitation.

8. The system of claim 7, wherein the signal processor is further configured to output a second data proportional to the exogenous excitation.

9. The system of claim 8, wherein the signal processor is further configured to process the second data to determine if the exogenous excitation exceeds a defined limit.

10. The system of claim 7, wherein the signal processor is further configured to output second data proportional to the sensitivity of the sensing elements.

11. The system of claim 10, wherein the signal processor is further configured to generate third data based on scaling the first data with the second data.

12. The system of claim 5, wherein the signal processor is configured to modify the reference data by amplification of the reference data.

13. The system of claim 5, wherein the signal processor is configured to modify the reference data by filtering the reference data.

14. The system of claim 5, wherein the signal processor is further configured to duty cycle the reference data.

15. The system of claim 1, wherein the plurality of reference elements further comprise reference electrodes disposed on the reference plane.

16. The system of claim 1, wherein the sensing elements further comprise sense electrodes on the reference plane, wherein the reference elements further comprise reference electrodes on the reference plane, and wherein the area of the sensing electrodes is different from the area of the reference electrodes.

17. The system of claim 1, wherein the gap between the sensing elements is different from the gap between the reference elements.

18. The system of claim 1, wherein one of the respective reference paddles is located substantially in the center of one of the sensing elements of the plurality of sensing elements.

19. The system of claim 1, further comprising:
   a second MEMS sensor coupled to the first MEMS sensor in a full wheatstone bridge configuration.

20. The system of claim 19, wherein at least one of the plurality of sensing elements comprises at least one of a plurality of capacitors.

21. The system of claim 1, further comprising:
   a wheatstone bridge configuration comprising the first MEMS sensor and a plurality of capacitors comprising complementary metal oxide semiconductor (CMOS) fixed capacitors.

22. The system of claim 21, wherein the plurality of capacitors comprise complementary metal oxide semiconductor (CMOS) fixed capacitors.

23. The system of claim 1, wherein the plurality of sensing elements are configured to be driven with a first voltage, wherein the plurality of reference elements are configured to be driven by a second voltage, wherein at least one of the plurality of sensing elements is configured to output a sense signal proportional to the first voltage in response to an external sense excitation on the MEMS system and further configured to output an offset signal proportional to the first voltage in response to the exogenous excitation, and wherein at least one of the plurality of reference electrodes is configured to output a reference signal proportional to the second voltage in response to an exogenous load on the MEMS system; and the system further comprising: a signal processor configured to combine the sense signal, the offset signal and the reference signal and output a signal that is proportional to an external sense excitation.

24. A system, comprising:
a microelectromechanical (MEMS) sensor comprising:
a first anchor connected to a reference plane;
a proof mass coupled to the first anchor via at least one spring, wherein the proof mass is configured to move along a first direction in response to a sense excitation and wherein the proof mass is configured to move along a first direction in response to an exogenous excitation;
a plurality of sensing elements coupled between the reference plane and the proof mass and configured to be responsive to motion of the proof mass in the first direction;

a plurality of reference paddles coupled to the reference plane via a second anchor, wherein the reference paddles are configured to move along a second direction in response to an exogenous excitation; and, a plurality of reference elements coupled between the reference plane and the reference paddles and configured to be responsive to motion of the reference paddles in the second direction; wherein, the sensitivity of the sensing elements in the first direction is different from the sensitivity of the reference elements in the second direction.

25. The system of claim 24, wherein the sense excitation is acceleration, magnetic field or ambient pressure.

26. The system of claim 24, wherein the first and second anchors are mechanically coupled to the reference plane via an anchor base.

* * * * *